United States Patent [19]
Langley et al.

[11] Patent Number: 5,169,487
[45] Date of Patent: Dec. 8, 1992

[54] ANISOTROPIC ETCH METHOD

[75] Inventors: Rod C. Langley; William J. Crane, both of Boise, Id.

[73] Assignee: Micron Technology, Inc., Boise, Id.

[21] Appl. No.: 574,340

[22] Filed: Aug. 27, 1990

Related U.S. Application Data

[63] Continuation-in-part of Ser. No. 382,403, Aug. 27, 1990, abandoned.

[51] Int. Cl.⁵ .......................................... H01L 21/306
[52] U.S. Cl. ................................... 156/643; 156/646; 156/653; 156/656; 156/657
[58] Field of Search ............... 156/653, 646, 643, 656, 156/657; 204/192.35, 192.37; 437/192, 193, 200, 233, 235, 238, 241

[56] References Cited

U.S. PATENT DOCUMENTS

| | | | |
|---|---|---|---|
| 4,383,885 | 5/1983 | Maydan et al. | 156/643 |
| 4,479,850 | 10/1984 | Beinvogl et al. | 156/643 |
| 4,578,559 | 3/1986 | Hijikata et al. | 156/646 X |
| 4,668,338 | 5/1987 | Maydan et al. | 156/646 X |
| 4,698,126 | 10/1987 | Van Roosmalen et al. | 156/653 X |
| 4,711,698 | 12/1987 | Douglas | 156/646 X |
| 4,717,448 | 1/1988 | Cox et al. | 156/646 X |
| 4,726,879 | 2/1988 | Bondur et al. | 156/643 |
| 4,778,563 | 10/1988 | Stone | 156/653 X |
| 4,789,426 | 12/1988 | Pipkin | 156/653 X |
| 4,971,655 | 11/1990 | Stefano et al. | 156/653 X |

OTHER PUBLICATIONS

One—Chamber Polycide Sandwich Etching, Rod C. Langley et al., pp. 95-97, Semiconductor International Oct. 1989.

*Primary Examiner*—Thi Dang
*Attorney, Agent, or Firm*—Stanley N. Protigal

[57] ABSTRACT

A method to anisotropically etch an oxide/silicide/poly sandwich structure on a silicon wafer substrate in situ, that is, using a single parallel plate plasma reactor chamber and a single inert cathode, with a variable gap between cathode and anode. This method has an oxide etch step and a silicide/poly etch step, both of which are performed as plasma etch steps. The process allows a continuous etch to be applied without removing the wafer from the plasma reactor chamber. The fully etched sandwich structure has a vertical profile at or near 90° from horizontal, with no bowing or notching.

31 Claims, 1 Drawing Sheet

ANISOTROPIC ETCH METHOD

CROSS REFERENCE TO RELATED APPLICATION

This is a continuation in part of U.S. patent application 382,403, filed Aug. 27, 1990; now abandoned.

BACKGROUND OF THE INVENTION

1. Field of the Invention

The present invention relates to etching methods used in the fabrication of integrated electronic circuits on a semiconductor substrate such as silicon, particularly a single-chamber/single-cathode (in situ) method of anisotropically plasma etching a sandwich structure of an oxide, tungsten silicide, and polycrystalline silicon, or equivalent structure.

An electronic circuit is chemically and physically integrated into a substrate such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, which is essential for transistor and diode fabrication. Degrees of resistance, capacitance, and conductivity are controllable, as are the physical dimensions and locations of the patterned regions and layers, making circuit integration possible. Fabrication can be quite complex and time consuming, and therefore expensive. It is thus a continuing quest of those in the semiconductor fabrication business to reduce fabrication times and costs of such devices in order to increase profits. Any simplified processing step or combination of processes at a single step becomes a competitive advantage.

2. Description of the Related Art

A situation where a process simplification is desirable is in the anisotropic etch of a layer of oxide on a layer of silicide on a layer of poly (also called a oxide/silicide/poly sandwich structure). In this disclosure, "oxide" denotes an oxide of silicon, "silicide" is short for tungsten silicide, and "poly" is shoptalk for polycrystalline silicon. "Polycide" denotes a silicide-over-poly combination. Oxide is an insulator with dielectric properties. Poly is resistive in nature, but is made less resistive when doped with an element having less or more than four valence electrons, or when layered with conductive silicide.

An oxide/silicide/poly sandwich structure presents a difficult etching task, particularly with an additional mask layer of photoresist ("resist"), which must be the case if patterning is desired. The difficulty is due to the distinct differences in the way oxide and polycide are etched, particularly with resist still present on top of the structure.

Both oxide and polycide can be etched using a parallel plate plasma reactor. However, an oxide is typically etched in fluorine deficient fluorocarbon based plasmas, whereas silicide and poly can be etched in fluorine or chlorine based discharges. Reactor cathode materials may also differ: for oxide etch, an erodible cathode such as graphite or silicon is often used to provide a source of carbon or silicon for etch selectivity, whereas for polycide etch, an inert cathode is preferred, especially when utilizing chlorine gas ($Cl_2$) for selectivity. If a single-chamber process were attempted using conventional art to etch an oxide/silicide/poly sandwich structure, the erodible cathode required for oxide etch would be destroyed by the chlorine required for polycide etch. Using conventional methods, the two steps are incompatible.

Oxide etch in general is fairly well understood, given a universal need for a vertical profile. This vertical profile is realized primarily by ion induced reaction with the oxide, coupled with normal incidence of the ions onto the oxide surface. The amount and energy of these ions are primarily controlled by the reactor's rf power and gap. Generally, a fluorocarbon-based gas mixture is introduced at a low pressure into the etch chamber. The exact gas composition is chosen, and an erodible cathode is used to scavenge excessive fluorine radicals so that the fluorine-to-carbon ratio is near, but not beyond, the so-called polymerization point. Under these conditions, when a plasma is ignited, the fluorocarbons are dissociated and release fluorine radicals and $CF_x$ species. Although fluorine radicals etch oxide, they do so very slowly: the primary etchant for oxide is considered to be the $CF_x$ species. Some of these species diffuse to the oxide surface where, with the assistance of ion bombardment, they react with the oxide and release volatile byproducts $SiF_4$, $CO$, and $CO_2$. In addition, some of the $CF_x$ species react with each other to form fluorocarbon polymers. Polymer that forms on horizontal surfaces is removed by vertical ion bombardment. Polymer that forms on vertical sidewalls is not significantly degraded by the bombardment, and actually serves a useful purpose by protecting the sidewalls from attack by the etchant species. This sidewall protection enables the achievement of vertical profiles, adjustable by varying the fluorine-to-carbon ratio. As the cathode is eroded, the quantity of available fluorine radicals is reduced. Therefore, a polymer-producing gas such as $CHF_3$ is balanced against a fluorine producing gas such as $CF_4$ to provide proper selectivity, with assistance to sidewall protection.

Two methods are presently used to etch an oxide/silicide/poly sandwich structure. Both methods use separate reactors: one for oxide etch, and one for polycide etch. The first method involves etching the oxide in an oxide etch reactor, using an erodible cathode. After oxide etch, the resist is removed from the wafer. Silicide and poly are then etched in a poly etch reactor, using an inert cathode. Both etches are anisotropic.

The second method uses the same principles as the first, except that there are two reactors in one machine. The two reactors are configured as separate oxide and polycide reactors having a common vacuum transfer area, so that a wafer can be transferred in a vacuum from the oxide reactor to the polycide reactor, thus minimizing additional handling. The resist is generally not removed prior to polycide etch in this method. This is sometimes referred to as "in situ" since the wafers never leave the vacuum of one machine. However, they are etched in two different etch chambers and are not truly in situ in the sense of this disclosure.

It would be of great advantage to etch oxide and polycide truly "in situ", that is, in one reactor chamber, with a single cathode.

SUMMARY OF THE INVENTION

An object of the present invention is to provide a method of anisotropically etching an oxide/silicide/poly sandwich structure in situ. Other objects of the invention are a fast processing time, and improved process yield and cleanliness.

In summary, the inventive process is as follows. A wafer having the sandwich structure described above, coated with a mask layer of resist, is transferred into the chamber of a parallel plate plasma reactor, having an anodized aluminum cathode and a variable gap, for two steps: oxide etch and polycide etch. In the oxide etch step, oxide not protected by resist is exposed to a plasma of about 1.9 W/cm$^2$ power density at a 0.48 cm gap, in a 2.3 torr atmosphere of 50 sccm $C_2F_6$, 100 sccm He, 40 sccm $CF_4$, and 32 sccm $CHF_3$.

Immediately after the oxide etch step, in the same chamber and using the same cathode, silicide and poly layers are etched in a plasma of about 0.57W/cm$^2$ at a 1.0 cm gap in a 0.325 torr atmosphere of 90 sccm $Cl_2$ and 70 sccm He. The finished structure has a vertical profile at or near 90° from horizontal, with no bowing or nothing. The entire inventive process takes about 3 minutes.

In an alternate embodiment of the invention, the silicide and poly layers etch step is accomplished in an atmosphere containing $Cl_2$, HCL or a combination of $Cl_2$ and HCl.

DETAILED DESCRIPTION OF THE PREFERRED EMBODIMENT

Figure 1:
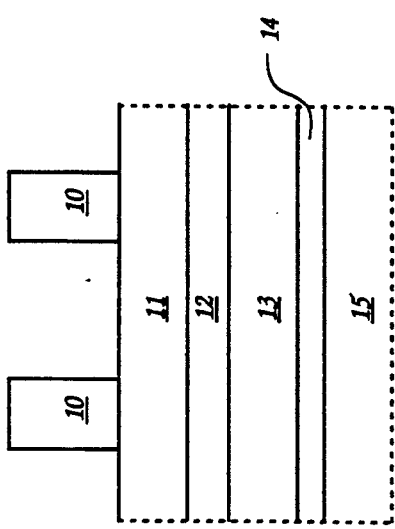
FIG. 1 shows a cross-sectioned oxide/silicide/poly prior to the inventive etch.

As illustrated in FIG. 1, a photoresist mask layer 10 is aligned and developed on a sandwich structure of oxide 11, silicide 12, and poly 13 on gate oxide 14 of a silicon wafer substrate 15. Fabrication and masking of this structure are done by methods well known to those skilled in semiconductor design and processing, and hence are not fully disclosed herein. The preferred embodiment of the inventive method is well suited to etch a 3,000 angstrom layer of TEOS oxide (an oxide of silicon, derived from tetraethylorthosilicate) on 1,200 angstroms of tungsten silicide 12 on 3,000 angstroms of poly 13.

Figure 2:
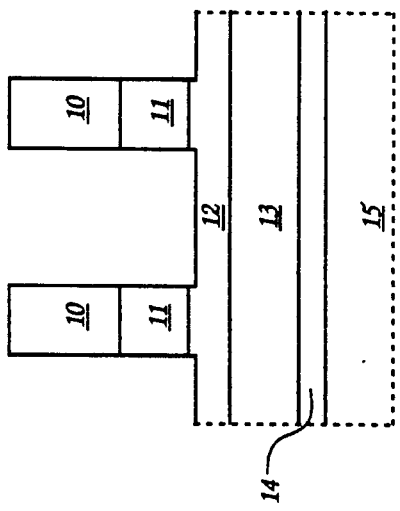
FIG. 2 shows a cross-section of said structure after oxide etch.

The wafer having the masked structure is transferred into the chamber of a Lam 790 parallel plate plasma reactor, having an anodized aluminum cathode, a variable gap, and a 13.56 MHz rf power plasma generator for an inventive process having two steps: oxide etch and polycide etch. In the oxide etch step, oxide 11 not protected by resist 10 is exposed to a plasma of about 1.9 W/cm$^2$ power density at a 0.48 cm gap, in a 2.3 torr atmosphere of 50 sccm $C_2F_6$, 100 sccm He, 40 sccm $CF_4$, and 32 sccm $CHF_3$. In this disclosure, "sccm" denotes standard cubic centimeters per minute, and "gap" refers to the distance between plasma electrodes, one of which supports the wafer. After the oxide etch step, which takes under a minute, the structure appears as shown in FIG. 2.

Figure 3:
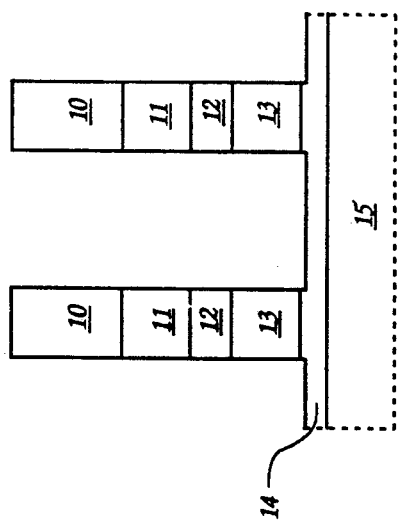
FIG. 3 shows a cross-section of said structure after polycide etch.

Immediately after the oxide etch step, in the same chamber and using the same cathode, silicide and poly layers 12 and 13 are etched in a plasma of about 0.57 W/cm$^2$ at a 1.0 cm gap in a 0.325 torr atmosphere of 90 sccm $Cl_2$ and 70 sccm He. This etch takes a little over 2 minutes, with the entire inventive process taking about 3 minutes. The finished structure appears as shown in FIG. 3, with a profile at or near 90° from horizontal, with no bowing or notching.

Details of the oxide etch step are now provided. Although preferred parameter values are stated above, plasma power density can range within about 0.18-4.0 W/cm$^2$, the gap can vary within about 0.3-0.6 cm, 0.38-0.52 cm being the preferred range, and the pressure can range within about 1.8-3.0 torr, although 2.2-2.4 torr is preferred. Gas quantities may vary, as long as at least about 5 sccm He is provided. Providing more $CF_4$ than $CHF_3$ makes a cleaner process, but this ratio can be varied if desired.

The inventive process uses a non-erodible anodized aluminum cathode, which increases the amount of available fluorine radicals. According to conventional thought, in order to maintain the same oxide-to-polycide selectivity as the prior art, the ratio of $CF_4$ to $CHF_3$ must be decreased to minimize fluorine radicals. It was found that this approach does not provide adequate selectivity without an excessive and quick buildup of polymer. This was solved by adding $C_2F_6$ to the chamber atmosphere as the predominant gas, which provides more $CF_x$ species and relatively few fluorine radicals, resulting in acceptable selectivity without excessive polymer buildup. $C_2F_6$ also resolves a "micromasking" problem, in which areas of underlying polycide were not being etched. Although the cause is unclear, it is speculated that the $CF_x$ species reacted with the tungsten silicide, forming a polymer layer which interfered with subsequent polycide etching. $C_2F_6$ evidently produces a polymer without this affinity for tungsten silicide, thereby eliminating micromasking.

The inventive process includes a high pressure atmosphere in order to produce a faster oxide etch rate. High pressure results in a higher fluorine radical flux on the oxide surface. When combined with high rf power, the etch rate is increased. High pressure and rf power do have drawbacks, however. Although rf induced ion bombardment assists in oxide etch, it also contributes to photoresist erosion, which is undesirable. Further, if rf power is too high, the resist will "burn" or reticulate. Higher pressure makes a thicker atmosphere, scattering ions and gas radicals in the plasma, resulting in more sidewall etching than with a low pressure system.

The oxide etch step of the inventive method includes an overetch of about 45 seconds to fully clear all residual oxide. Although the $C_2F_6/CF_4/CHF_3$ gas mixture etches underlying polycide during overetch, the etch continues to be anisotropic because of the sidewall passivation provided by the halocarbon-derived polymer and from the carbon introduced by eroding resist. After oxide has been cleared, the polycide-to-resist etch rate ratio is approximately 1.8:1.

Polycide etch step details are now provided. Although preferred parameter values have been stated, plasma power density can range within about 0.18-2.0 W/cm$^2$, the gap can vary within about 0.5-2.5 cm, 0.8-1.5 cm being the preferred range, and the pressure can range within about 0.200-0.550 torr, although about 0.300-0.425 torr is preferred. Quantities of the gases may vary, as long as at least about 50 sccm He is provided. It is contemplated that $SiCl_4$ or $BCl_3$ or a combination thereof might be used to provide additional $Cl_2$, if desired.

The lower pressure of the polycide etch allows for more ion bombardment, which, with resist erosion and the $Cl_2$ concentration, determines the etch rate and profile of the silicide and poly layers 12 and 13. $Cl_2$ provides the necessary selectivity to the polycide, so that minimal underlying gate oxide 14 is etched. Fluorine can also be used, but $Cl_2$ is preferred because it provides superior selectivity. The resist used must therefore be able to reasonably withstand a chlorine based plasma. The preferred embodiment utilizes Hunt's 6512 resist, developed with Hunt's photoresist developer 428. It is realized that other resists, developers, and mask layer compositions can be used as well.

An additional benefit of the inventive method is the ability to use carbon generated by the resist to help passivate polycide sidewalls, which means that carbon-containing gases do not have to be added to the gas mixture during polycide etch.

There is an upper rf power limit that can be safely used before the poly-to-gate oxide selectivity is reduced to the point where the poly cannot be completely etched without removing all of the exposed gate oxide. The inventive process provides a selectivity of approximately 13:1. Variations in the chlorine flow and total pressure do not significantly change this selectivity, although an increase in rf power reduces it.

In both of the inventive steps, helium is added to improve etch uniformity. The pressure, power, and various gas quantities are balanced to produce the fastest etch rates while preserving selectivity.

In an alternate embodiment of the invention, the silicide and poly layers etch step is accomplished in an atmosphere containing $Cl_2$, HCL or a combination of $Cl_2$ and HCl. More broadly speaking, the atmosphere contains a chlorine containing compound, such as $Cl_2$ or HCL.

By way of example, 0-200 sccm C12, 0-200 sccm HCl, and 0-200 sccm inert carrier are supplied at 325 to 550 mtorr. A plasma is applied with an rf power of 75 W to 400 W, across a 0.60 cm to 2.0 cm. gap electrode height.

This can be performed as a two step etch for the metal silicide and poly, which would a bulk etch and a highly selective etch. Alternatively, this can be performed as a single step etch, with reasonable selectivity.

One particular process is:

Perform bulk etch through $WSi_x$ in an atmosphere of 500 mtorr of 90 $Cl_2$, 30 HCl. The plasma was applied at 250 W, across a 0.80 cm. gap. This is followed by a high selective poly etch at 500 mtorr using 60 HCl, 70 He, at 100 W across a 0.80 cm. gap.

Clearly, in view of the above disclosure, other embodiments of this invention will present themselves to those of ordinary skill in semiconductor processing, such as applying the invention to other kinds of masking layers, oxide, silicide, and poly, and varying thickness and doping of each layer etched. Since the inventive process includes one step for polycide etch, a simple oxide/poly structure can be etched instead of an oxide/silicide/poly structure, without materially altering the process. It is also conceivable that plasma power density and gap may be varied, gas quantities adjusted, similar gases substituted, or some other inert material used for the cathode, to achieve same or similar results. Gas quantities may also be changed while preserving essentially similar ratios of one gas to another. Another make of reactor might also be chosen. These variations and others are intended to be circumscribed by these claims.

What is claimed is:

1. A method of anisotropically etch material on a wafer, on which an oxide overlies a layer of silicon deposited over a substrate, comprising the steps of:

a) providing a parallel plate plasma etch reactor, having a first electrode whereupon the substrate is mounted, and having a second electrode that is non-erodible by plasma;
    b) providing a first atmosphere within said reactor, containing $C_2F_6$, $CHF_3$, $CF_4$, and an inert carrier gas, said first atmosphere containing more $C_2F_6$ than $CF_4$, and more $C_2F_6$ than $CHF_3$;
    c) exposing the oxide layer to a plasma maintained at said first atmosphere, thereby etching the oxide layer;
    d) providing a second atmosphere within said reactor, containing a chlorine containing compound;
    e) exposing the wafer to a plasma maintained at said second atmosphere, thereby etching the layer of silicon to a subjacent layer.

2. The method of claim 1, wherein:
    said atmosphere containing a chlorine compound contains Cl2, HCl, and an inert carrier.

3. The method of claim 2, wherein said atmosphere containing a chlorine compound contains less than 200 sccm $Cl_2$, and less than 200 sccm HCl.

4. The method of claim 1, wherein the atmosphere containing a chlorine compound contains less than 200 sccm $Cl_2$, and less than 200 sccm HCl.

5. The method of claim 4, wherein the atmosphere containing a chlorine compound is supplied at a pressure of between 300 and 600 mtorr.

6. The method of claim 1, wherein:
    a) said first atmosphere has a pressure of approximately 2.3 torr and includes approximately 50 sccm $C_2F_6$, approximately 32 sccm $CHF_3$, approximately 40 sccm $CF_4$, and approximately 100 sccm He as its inert carrier gas;
    b) a power density of said plasma is approximately 1.9 $W/cm^2$;
    c) a gap of approximately 0.48 cm exists between said first and second electrodes; and
    d) said non-erodible second electrode is anodized aluminum.

7. The method of claim 1, wherein:
    a) said first atmosphere has a pressure within approximately 1.8 to 3.0 torr;
    b) a power density of said plasma is within approximately 0.18 to 4.0 $W/cm^2$;
    c) a gap within approximately 0.3 to 0.6 cm exists between said first and second electrodes; and
    d) said non-erodible second electrode is anodized aluminum.

8. The method of claim 1, wherein:
    a) said first atmosphere has a pressure within approximately 2.2 to 2.4 torr;
    b) a power density of said plasma is within approximately 0.18 to 4.0 $W/cm^2$;
    c) a gap within approximately 0.38 to 0.52 cm exists between said first and second electrodes; and
    d) said non-erodible second electrode is anodized aluminum.

9. The method of claim 1, wherein said first atmosphere includes at least approximately 5 sccm He as its inert carrier gas.

10. A method to anisotropically etch material on a wafer, on which an oxide overlies a metal silicide on a layer of polycrystalline silicon on a substrate, comprising the steps of:

a) providing a parallel plate plasma etch reactor, having a first electrode whereupon the substrate is mounted, and having a second electrode that is non-erodible by plasma;

b) providing a first atmosphere within said reactor, containing $C_2F_6$, $CHF_3$, $CF_4$, and an inert carrier gas;

c) exposing the oxide layer to a plasma maintained at said first atmosphere, thereby etching the oxide layer;

d) providing a second atmosphere within said reactor, said second atmosphere containing $Cl_2$, HCl, and an inert carrier, supplied at a pressure of between 300 and 600 mtorr and containing less than 200 sccm $Cl_2$, and less than 200 sccm HCl; and e) exposing the wafer to a plasma maintained at said second atmosphere, thereby etching the metal silicide to a subjacent layer.

11. The method of claim 10, wherein:
a) said first atmosphere has a pressure within approximately 0.200 to 0.550 torr;
b) a power density of said plasma is within approximately 0.18 to 2.0 W/cm$^2$;
c) a gap within approximately 0.8 to 1.5 cm exists between said first and second electrodes; and
d) said non-erodible second electrode is anodized aluminum.

12. The method of claim 10, wherein said first atmosphere includes at least approximately 50 sccm He.

13. The method of claim 10, wherein the metal silicide is tungsten silicide.

14. A method to anisotropically etch material on a wafer, on which an oxide overlies a layer of silicon deposited over a substrate, comprising the steps of:
a) providing a parallel plate plasma etch reactor, having a first electrode whereupon the substrate is mounted, and having a second electrode that is non-erodible by plasma;
b) providing a first atmosphere within said reactor, containing $C_2F_6$, $CHF_3$, $CF_4$, and an inert carrier gas;
c) exposing the oxide layer to a plasma maintained at said first atmosphere, thereby etching the oxide layer;
d) providing a second atmosphere within said reactor, containing a chlorine containing compound, said atmosphere being supplied at a pressure of between 300 and 600 mtorr; and
e) exposing the wafer to a plasma maintained at said second atmosphere, thereby etching the layer of silicon to a subjacent layer.

15. The method of claim 14, wherein:
said atmosphere containing a chlorine compound contains Cl2, HCl, and an inert carrier.

16. The method of claim 14, wherein the atmosphere containing a chlorine compound contains less than 200 scm $Cl_2$, and less than 200 sccm HCl.

17. The method of claim 14, wherein said first atmosphere includes at least approximately 5 sccm He as its inert carrier gas.

18. A method to anisotropically etch material on a wafer on which an oxide overlies a layer of silicon deposited over a substrate, comprising the steps of:
a) providing a parallel plate plasma etch reactor, having a first electrode whereupon the substrate is mounted, and having a second electrode that is non-erodible by plasma, whereby a gap of approximately 0.48 cm exists between said first and second electrodes and said non-erodible second electrode is anodized aluminum;

b) providing a first atmosphere within said reactor, containing $C_2F_6$, $CHF_3$, $CF_4$, and an inert carrier gas, said first atmosphere having a pressure of approximately 2.3 torr and including approximately 50 sccm $C_2F_6$, approximately 32 sccm $CHF_3$, approximately 40 sccm $CF_4$, and approximately 100 sccm He as its inert carrier gas;

c) exposing the oxide layer to a plasma maintained at said first atmosphere at a power density of approximately 1.9 W/cm$^2$, thereby etching the oxide layer;

d) providing a second atmosphere within said reactor, containing a chlorine containing compound; and e) exposing the wafer to a plasma maintained at said second atmosphere, thereby etching the layer of silicon to a subjacent layer.

19. A method to anisotropically etch material on a wafer, on which an oxide overlies a layer of silicon deposited over a substrate, comprising the steps of:
a) providing a parallel plate plasma etch reactor, having a first electrode whereupon the substrate is mounted, and having a second electrode that is non-erodible by plasma, whereby a gap within approximately 0.3 to 0.6 cm exists between said first and second electrodes and said non-erodible second electrode is anodized aluminum;
b) providing a first atmosphere within said reactor, containing $C_2F_6$, $CHF_3$, $CF_4$, and an inert carrier gas, at a pressure within approximately 1.8 to 3.0 torr;
c) exposing the oxide layer to a plasma maintained at said first atmosphere at a power density of said plasma is within approximately 0.18 to 4.0 W/cm$^2$, thereby etching the oxide layer;
d) providing a second atmosphere with in said reactor, containing a chlorine containing compound, said atmosphere being supplied at a pressure of between 300 and 600 mtorr; and
e) exposing the wafer to a plasma maintained at said second atmosphere, thereby etching the layer of silicon to a subjacent layer.

20. The method of claim 19, wherein:
a) said first atmosphere has a pressure within approximately 2.2 to 2.4 torr; and
b) a gap within approximately 0.38 to 0.52 cm exists between said first and second electrodes.

21. A method to anisotropically etch material on a wafer, on which an oxide overlies a metal silicide on a layer of polycrystalline silicon on a substrate, comprising the steps of:
a) providing a parallel plate plasma etch reactor, having a first electrode whereupon the substrate is mounted, and having a second electrode that is non-erodible by plasma;
b) providing a first atmosphere within said reactor, containing $C_2F_6$, $CHF_3$, $CF_4$, and an inert carrier gas;
c) exposing the oxide layer to a plasma maintained at said first atmosphere, thereby etching the oxide layer, wherein said oxide layer is masked with a mask layer that releases carbon as it erodes;
d) providing a second atmosphere within said reactor, said second atmosphere containing $Cl_2$, HCl, and an inert carrier, supplied at a pressure of between 300 and 600 mtorr and containing less than 200 sccm $Cl_2$, and less than 200 sccm HCl; and e) exposing the wafer to a plasma maintained at said second atmosphere, thereby etching the metal silicide to a subjacent layer.

22. The method of claim 21, wherein the metal silicide is tungsten silicide.

23. A method to anisotropically etch material on a wafer, on which an oxide overlies a metal silicide on a layer of polycrystalline silicon on a substrate, comprising the steps of:
   a) providing a parallel plate plasma etch reactor, having a first electrode whereupon the substrate is mounted, and having a second electrode that is non-erodible by plasma;
   b) providing a first atmosphere within said reactor, containing $C_2F_6$, $CHF_3$, $CF_4$, and an inert carrier gas, said first atmosphere containing more $C_2F_6$ than $CF_4$, and more $C_2F_6$ than $CHF_3$;
   c) exposing the oxide layer to a plasma maintained at said first atmosphere, thereby etching the oxide layer;
   d) providing a second atmosphere within said reactor, contains $Cl_2$, HCl, and an inert carrier; and
   e) exposing the wafer to a plasma maintained at said second atmosphere, thereby etching the metal silicide to a subjacent layer.

24. The method of claim 23, wherein said oxide layer is masked with a mask layer that releases carbon as it erodes.

25. The method of claim 23, wherein the metal silicide is tungsten silicide.

26. A method to anisotropically etch material on a wafer, on which an oxide overlies a metal silicide on a layer of polycrystalline silicon on a substrate, comprising the steps of:
   a) providing a parallel plate plasma etch reactor, having a first electrode whereupon the substrate is mounted, and having a second electrode that is non-erodible by plasma;
   b) providing a first atmosphere within said reactor, containing $C_2F_6$, $CHF_3$, $CF_4$, and an inert carrier gas;
   c) exposing the oxide layer to a plasma maintained at said first atmosphere, thereby etching the oxide layer;
   d) providing a second atmosphere within said reactor, contains $Cl_2$, HCl, and an inert carrier, the second atmosphere supplied at a pressure of between 300 and 600 mtorr; and
   e) exposing the wafer to a plasma maintained at said second atmosphere, thereby etching the metal silicide to a subjacent layer.

27. The method of claim 26, wherein said oxide layer is masked with a mask layer that releases carbon as it erodes.

28. The method of claim 26, wherein the metal silicide is tungsten silicide.

29. A method to anisotropically etch material on a wafer, on which an oxide overlies a metal silicide on a layer of polycrystalline silicon on a substrate, comprising the steps of:
   a) providing a parallel plate plasma etch reactor, having a first electrode whereupon the substrate is mounted with a gap within approximately 0.8 to 1.5 cm exists between said first and second electrodes, and having a second electrode that is non-erodible by plasma that is made of anodized aluminum;
   b) providing a first atmosphere within said reactor, containing $C_2F_6$, $CHF_3$, $CF_4$, and an inert carrier gas, said first atmosphere having a pressure within approximately 0.200 to 0.550 torr;
   c) exposing the oxide layer to a plasma maintained at said first atmosphere at a power density within approximately 0.18 to 2.0 W/cm$^2$, thereby etching the oxide layer;
   d) providing a second atmosphere within said reactor, contains $Cl_2$, HCl, and an inert carrier; and
   e) exposing the wafer to a plasma maintained at a said second atmosphere, thereby etching the metal silicide to a subjacent layer.

30. The method of claim 34, wherein said oxide layer is masked with a mask layer that releases carbon as it erodes.

31. The method of claim 29, wherein the metal silicide is tungsten silicide.

* * * * *

UNITED STATES PATENT AND TRADEMARK OFFICE
CERTIFICATE OF CORRECTION

PATENT NO. : 5,169,487

DATED : December 8, 1992

INVENTOR(S) : Rod C. Langley, William J. Crane

It is certified that error appears in the above-identified patent and that said Letters Patent is hereby corrected as shown below:

Col. 3, line 17, replace "nothing" with --notching--.

Col. 3, line 24, after "poly" add the following -- sandwich structure with a patterned resist mask layer,--.

Col. 5, line 51, after the period (".") add, -- In a more general sense, the inventive method may be used to anisotropically etch material on a wafer, on which a dielectric overlies a layer of silicon deposited over a substrate.--

Col. 5, line 51, after "etched", begin a new paragraph.

Col. 5, line 65, delete "of" and add --to--.

Col. 7, line 55, delete "scm" and insert --sccm--.

Signed and Sealed this

Eighteenth Day of May, 1993

Attest:

MICHAEL K. KIRK

Attesting Officer

Acting Commissioner of Patents and Trademarks